United States Patent [19]

White et al.

[11] 4,112,507
[45] Sep. 5, 1978

[54] ADDRESSABLE MNOS CELL FOR NON-VOLATILE MEMORIES

[75] Inventors: Marvin Hart White, Laurel; Donald Ross Lampe, Ellicott City, both of Md.

[73] Assignee: Westinghouse Electric Corp., Pittsburgh, Pa.

[21] Appl. No.: 653,849

[22] Filed: Jan. 30, 1976

[51] Int. Cl.$^2$ .................................................. G11C 11/40
[52] U.S. Cl. ........................................ 365/184; 357/23
[58] Field of Search ................... 340/173 R, 173 CA; 357/23, 54; 365/184, 185

[56] References Cited

U.S. PATENT DOCUMENTS

| 3,720,922 | 3/1973 | Kosonocky | 340/173 R |
| 3,728,695 | 4/1973 | Bentchkowsky | 340/173 R |
| 3,744,036 | 7/1973 | Bentchkowsky | 340/173 R |

Primary Examiner—Bernard Konick
Assistant Examiner—Donald McElheny
Attorney, Agent, or Firm—H. W. Patterson

[57] ABSTRACT

An addressable MNOS transistor structure is disclosed employing a plurality of gate regions between the source and drain diffusion regions of each transistor cell. The transistor cell is characterized by high and low threshold states which are settable by selective actuation of the corresponding plurality of gate regions. Reading of the state of the transistor is accomplished by applying a read voltage, having a value intermediate the two threshold values, to the corresponding plurality of gate regions and measuring whether or not an applied charge discharges from one diffusion region to the other.

17 Claims, 7 Drawing Figures

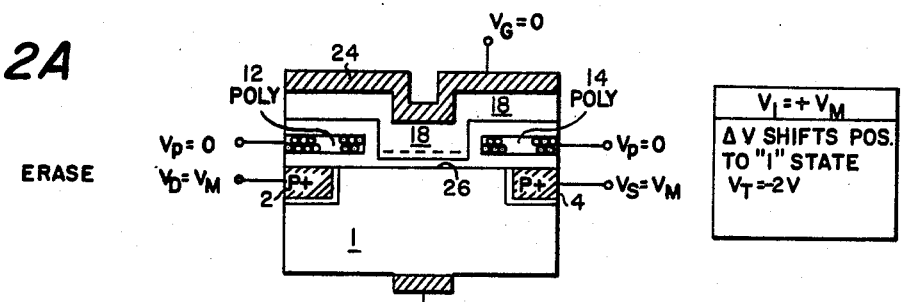
FIG. 2A ERASE
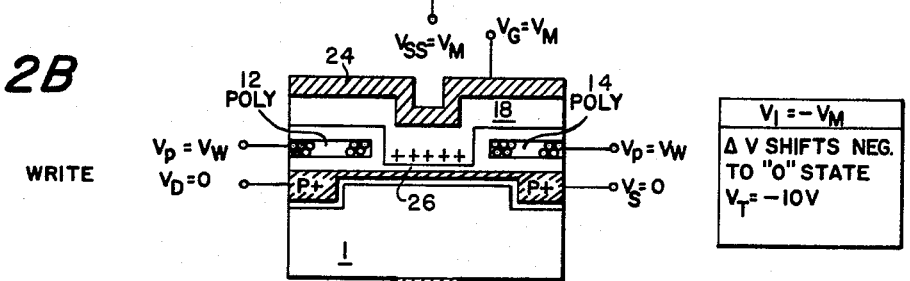
FIG. 2B WRITE
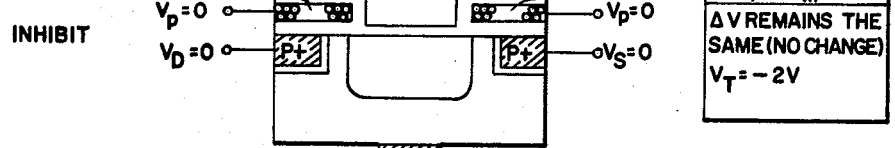
FIG. 2C INHIBIT
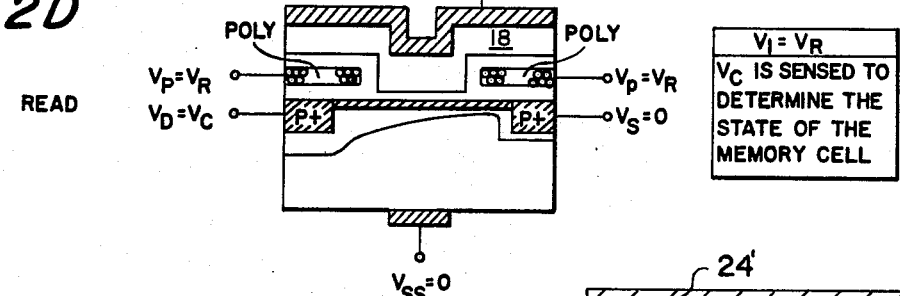
FIG. 2D READ
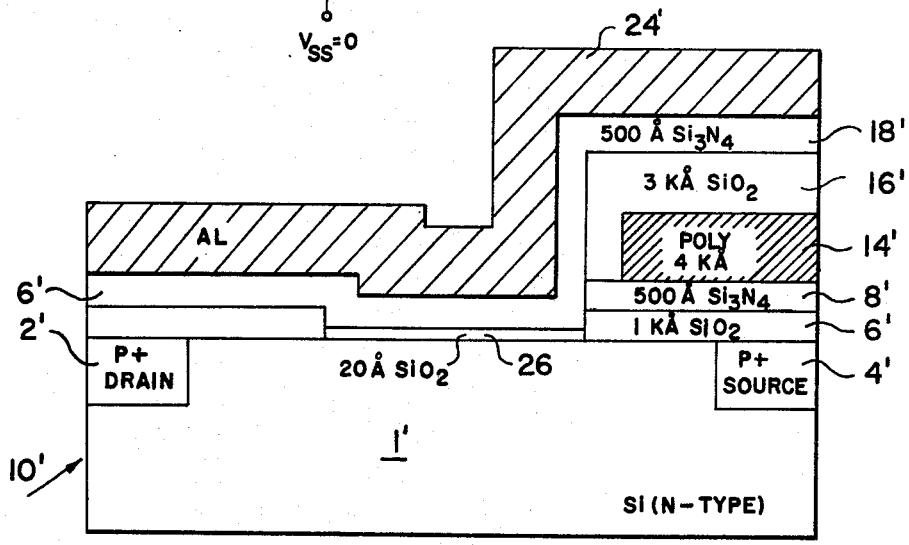
FIG. 3

ADDRESSABLE MNOS CELL FOR NON-VOLATILE MEMORIES

BACKGROUND OF THE INVENTION

Field of the Invention

The present invention relates to an improved MNOS transistor employed in non-volatile memory devices.

State of the Prior Art

In the past, the metal-nitride-oxide-silicon (MNOS) structure has been employed in non-volatile charge-storage memory arrays. The MNOS structure was generally configured in the form of a transistor with source and drain terminals and a single memory gate for "current accessing" the stored charge. The stored charge determined the threshold voltage of the transistor, which in turn, affected the magnitude of the current flow between the source and drain terminals for specified read voltage on the memory gate electrode. In attempting miniaturization, it was found that as the prior art MNOS structure was reduced in size, such factors as read disturb effect, and speed were detrimentally affected.

SUMMARY OF THE INVENTION

The present invention introduces a novel MNOS structure having the form of a transistor with source and drain terminals and featuring a plurality of address gates for each cell. The novel MNOS structure of the present invention may be incorporated in non-volatile memory cells and packed to an extremely high density of non-volatile memories approximately 0.5mil²/bit, ideal for LSI usage. The MNOS cell of the present invention, provides for a unique address configuration for this type structure in the form of an array of MNOS cells disposed in a cross-point geometry. Such an array permits the use of matrix addressing techniques to write data into the selected memory cell or read the threshold state of the selected memory cell. The structure of the novel MNOS transistor includes a substrate of a first conductivity type having parallel channels of a second conductivity type diffused therein. The diffusion regions are used as drain and source elements of the transistor. Memory gates of aluminum are formed in rows orthogonal to the parallel channels to establish memory windows between the diffusion areas. A second gate of polysilicon is formed in a column parallel to the diffusion channels, spacially overlapping a corresponding diffusion channel and having a width extending to establish a second gate region therebelow between the diffusion region and the memory window for each cell. The formation of the plurality of diffusion regions, and overlapping and parallel polysilicon gates create an array of individual memory cells defined by the corresponding intersection of each memory gate. Combined insulating layers of silicon dioxide and silicon nitride are used to form thin and thick gate regions under the respective aluminum and polysilicon gates.

It should be understood that the MNOS transistor of the present invention is formed by a standard photolithographic process wherein the polysilicon gates are formed prior to the formation of the aluminum memory gate and are necessarily therebelow.

The MNOS transistor of the present invention may be placed in either a high or low threshold state by selective activation of the memory gate and the polysilicon gate (address gates) with respect to the substrate, the drain region and the source region. The MNOS transistor is non-volatile and does not change its threshold state until the opposite state is set therein.

The state of the MNOS transistor is determined by applying a read voltage to the corresponding address gates. The read voltage has a value intermediate to the threshold state levels and causes an external charge applied to a diffusion region to be discharged for one state and not discharged for the other state. The monitoring of the applied external charge to the diffusion region with the simultaneous application of read voltage to the corresponding address gates constitutes the reading of the state of the transistor. The present invention is, therefore, ideal for use in memory cell arrays wherein high density is required.

It is an object of the present invention to provide a novel MNOS transistor with a plurality of address gates.

It is also an object of the present invention to provide a novel MNOS transistor for use in a non-volatile memory.

It is another object of the present invention to provide a novel MNOS transistor structure wherein a plurality of MNOS transistors are established on a single substrate with source and drain diffusion areas extending in linear directions parallel to each other and orthogonal to a plurality of memory gates.

It is still another object of the present invention to provide a high density non-volatile memory array having dimensions as low as about 0.5mil²/bit.

It is a further object of the present invention to provide an MNOS memory cell being in a high or low threshold state and being read by monitoring the amount of discharge from one diffusion region to the other when the corresponding address gates have a read voltage applied thereto intermediate to the high and low threshold states.

BRIEF DESCRIPTION OF THE DRAWINGS

FIG. 2A is a cross-section of the preferred embodiment of the non-volatile memory cell of the present invention in the "erase" mode.

FIG. 2B is a cross-section of of the preferred embodiment of the non-volatile memory cell of the present invention in the "write" mode.

FIG. 2C is a cross-section of the preferred embodiment of the non-volatile memory cell of the present invention in the "inhibit" mode.

FIG. 2D is a cross-section of the preferred embodiment of the non-volatile memory cell of the present invention in the "read" mode.

FIG. 3 is a cross-section of an alternative embodiment of the present invention.

DETAILED DESCRIPTION OF THE PREFERRED EMBODIMENT

The novel MNOS transistor of the present invention is ideal for LSI and high density requirements, since the use of multiple address gates for each transistor make it convenient for matrix addressing techniques, and thereby reducing the number of individual connections.

The embodiment of the present invention discussed below shows the use of two polysilicon gate regions and one memory gate (also referred to as an address gate) for each transistor (memory cell). However, it should be noted that a second embodiment has been devised by the inventors, and is shown in FIG. 3 wherein only one polysilicon address gate and one memory gate are used for addressing each transistor with results comparable to those of the preferred embodiment discussed below. Therefore, since the two embodiments are quite similar, and only the operations thereof differ, the favored embodiment is described in detail with those operational differences noted where appropriate.

Figure 1A:
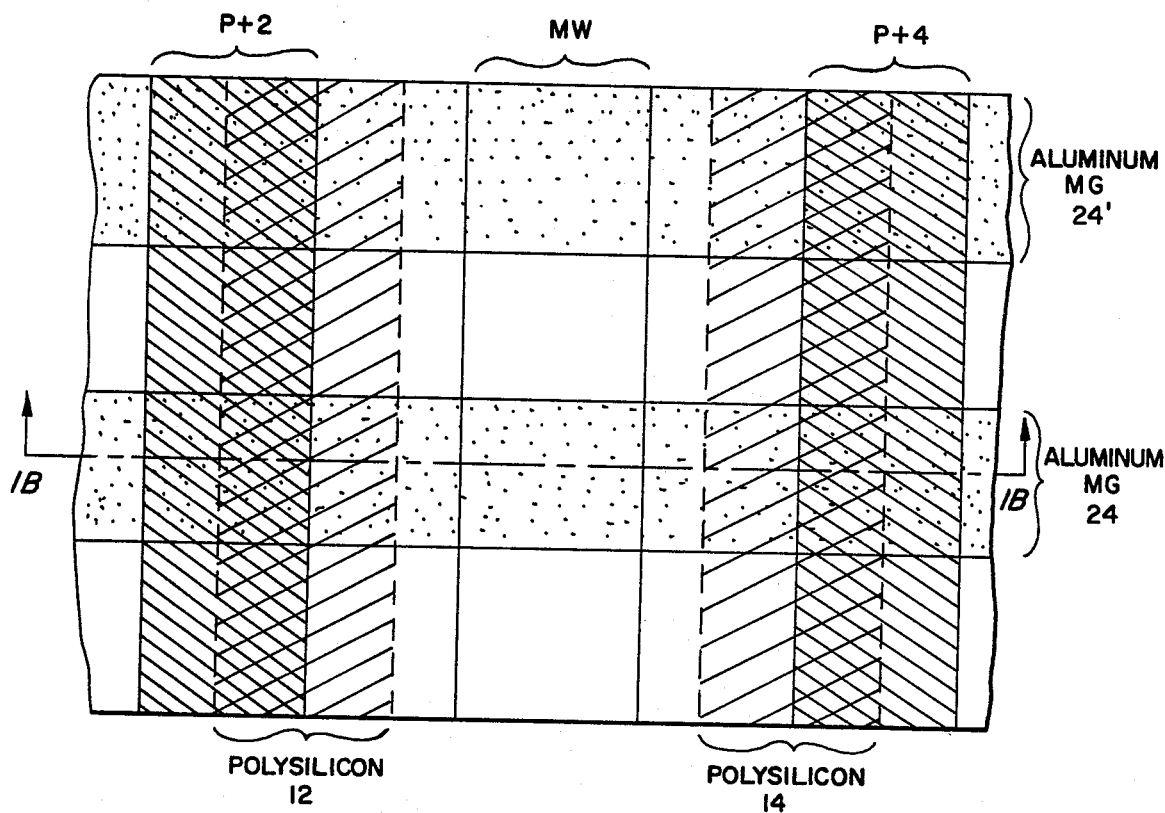
FIG. 1A is a plan view of an embodiment of the non-volatile memory cell of the present invention showing the relative location and configuration of the element array.
Figure 1B:
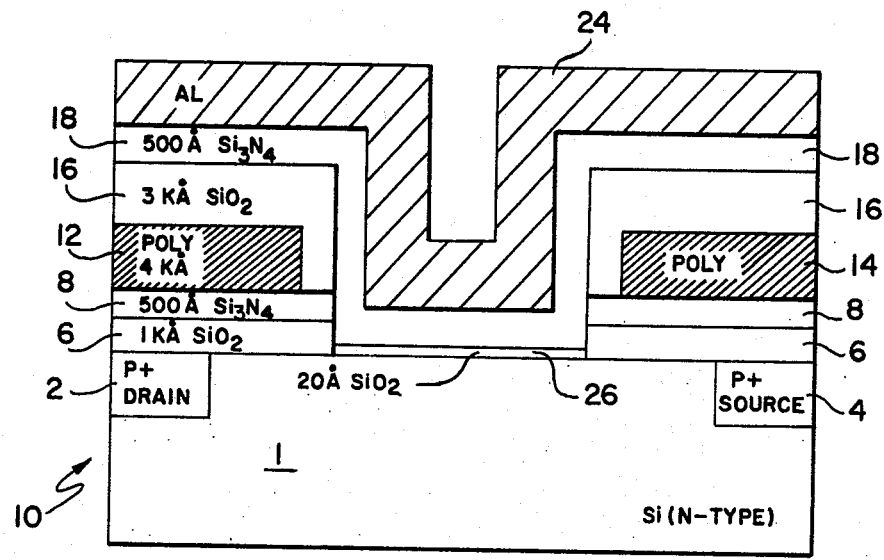
FIG. 1B is a cross-section of the embodiment of the non-volatile memory cell of the present invention shown in FIG. 1A.

With concurrent reference to FIGS. 1A and 1B, the novel MNOS transistor used as a non-volatile sequentially addressed memory (NOVSAM) cell 10 is discussed. A substrate of a known conductivity type such as N-type Si is shown with parallel channels of diffusion areas 2 and 4 of P+ material, which are the respective drain and source of the transistor. Drain-source protection is achieved by thick oxide coating 6. In this embodiment, the thick oxide coating 6 is preferably $SiO_2$ measuring 1KA. Coating 8 of $Si_3N_4$ measuring approximately 500A is coated over oxide coating 6 to form "thick" gate regions. Polysilicon gates 12 and 14, having a thickness of 4KA, are shown directly above the respective "thick" gates for control thereof. The polysilicon gates 12 and 14 extend parallel to the diffusion channels of the substrate and are insulated by the combined silicon dioxide/silicon nitride layers 6 and 8. The polysilicon gate 12 spacially overlaps the drain diffusion region 2 in a direction towards the source 4. Similarly, the polysilicon gate 14 spacially overlaps the source diffusion region 4 in a direction towards the gate 12. (In contrast, the suggested alternative embodiment shown in FIG. 3 eliminates the second polysilicon gate 12).

A "thin" gate region exists below an aluminum gate 24 and consists of an oxide coating 26 of $SiO_2$ measuring approximately 20A and the coating 18 of $Si_3N_4$ measuring approximately 500A. Coatings 16 and 18 above the polysilicon gates 12 and 14 provide insulative protection from the aluminum gate 24. The oxide coating 16 of $SiO_2$ measures approximately 3000A and the coating of silicon nitride 18 measures approximately 500A. In the preferred embodiment, three gate regions are provided for each NOVSAM memory cell. The polysilicon gates 12 and 14 are shown in FIG. 1A as having cross-point geometry with respect to the aluminum memory gate 24, since the P+ diffusions 2 and 4 are each continuous and parallel to the polysilicon gates 12 and 14, and orthogonal to the aluminum memory gates 24. Memory is obtained in the memory window (MW) in the addressed row and column memory cell transistor by electrically reversible tunneling of charge from the silicon substrate to deep traps at the silicon dioxide-silicon nitride interface in the "thin" gate region.

FIGS. 2A through 2D indicate the four modes of operation for which the MNOS transistor memory cell of the present invention is preferably employed.

FIG. 2A shows the "erase" mode of operation of the NOVSAM memory cell wherein the memory is cleared to a low threshold "1" state by grounding the aluminum gate 24 and the polysilicon gates 12 and 14. A polarizing voltage of $V_M = -25V$ is applied to the substrate, source and drain. The voltage across the insulator is $V_I = -V_M = +25V$. Due to the high value of $V_I$, tunneling occurs in the thin oxide region MW defined by layers 26 and 18, leaving a net negative charge near the nitride-oxide interface of layers 26 and 18. When the aluminum gate 24 is at the potential of the substrate, the net negative charge from tunneling causes depletion of the carriers beneath the thin oxide gate which, in conjunction with the thick oxide gate (where $V_T \approx -2V$.), determines the threshold voltage $V_T$ of the composite transistor. The memory cell is therefore in the low threshold erased state and will remain in said state until the cell enters the "write" mode.

The MNOS transistor memory cell enters the "write" mode, as shown in FIG. 2B, when the substrate, source and drain are grounded and a voltage of $V_M = -25V$ is applied to the aluminum gate 24 and the polysilicon gates 12 and 14. The voltage across the insulator $V_I = V_M = -25V$. The high value of $V_I$ across the insulating layers 26 and 18 causes tunneling to occur, at the thin oxide region MW and the nitride-oxide interface trap is left with a net positive charge. This tunneling causes an accumulation layer to be interposed between the source and drain of the transistor on the surface of the silicon substrate 1 at layer 26. The threshold voltage $V_T$ of the thin oxide region of the transistor becomes $V_T \approx -10V$, therefore placing the transistor memory element in a high threshold state. The high threshold state is dictated by this higher threshold value of $V_T$ at the thin oxide region rather than the thick oxide region, where the threshold remains low at $V_T \approx -2V$. Since the thin oxide region MW below the aluminum gate 24 determines the high threshold during the write mode, it is apparent that the polysilicon gate does not require the application of a high voltage ($V_M = -25V$). IT is only necessary that the voltage applied to the polysilicon gate be at least equal to the threshold of the thick oxide region ($V_T \approx -2V$). Such a voltage (more negative than $-2V$) applied to the polysilicon gates allows minority carriers to be coupled through an inversion region to the thin oxide portion MW of the gate where tunneling takes place, thereby disrupting the setting of the memory cell to the high threshold state.

In the alternative embodiment of FIG. 3 wherein the polysilicon gate 12 associated with the drain diffusion is deleted, the "write" mode of operation somewhat differs from that of the preferred embodiment. In the alternative embodiment, the drain 2' is charged to a voltage value approximating $V_M = -25V$, while a voltage $V_M$ is applied to the aluminum gate 24' and the polysilicon gate 14'. The source diffusion 4' is set to the substrate voltage (0 volts). The source will discharge the drain capacitance to 0 volts and tunneling will occur, as above, to "write" the transistor to a high threshold.

The write "inhibit" mode in preferred embodiment is achieved by grounding the drain, source, substrate and both polysilicon gates while applying $V_M = -25V$ to the aluminum gate 24. No minority carriers are present under the thin oxide gate since both polysilicon gates 12 and 14 are turned off, and no inversion region is present under the thick oxide gates of the transistor. The application of $V_M$ to the aluminum gate 24 causes a depletion region to be formed under the thin gate MW and the voltage across the insulator $V_I \approx -V_M/10$ since a capacitive divider is formed between the gate insulator and the resulting depletion layer. Therefore, since no minority carriers are supplied to the thin gate region, tunneling does not occur and the threshold of the device does not change.

In the alternative embodiment of FIG. 3 wherein the polysilicon gate 12 associated with the drain diffusion is deleted, the "inhibit" mode of operation somewhat differs from that of the preferred embodiment. In the alternative embodiment, the drain 2' is charged to a voltage value approximating $V_M = -25V$; the source 4', substrate 1' and polysilicon gate 14' are grounded; and a voltage of $V_M$ is applied to the aluminum gate 24'. No minority carriers are present under the thin gate since the polysilicon gate 14' is turned off and the drain is charged negatively. No discharge occurs in the depletion region and therefore, no tunneling occurs.

In order to "read" the state of the memory cell of both the above recited constructions, the drain is charged to $V_C = -15V$ and the source is grounded. A read signal $V_R = -6V$ is applied to the polysilicon gates 12 and 14 in the preferred embodiment or to the polysilicon gate 14' in the alternative embodiment as well as to the aluminum gate 24 (24'). Since the read voltage $V_R$ is greater than the low threshold voltage ($V_T \approx -2V$) of the thick oxide gate, an inversion region is formed under the thick oxide portions of the gate. Therefore, if the memory cell is in the low threshold state, an inversion region will also be formed under the thin oxide portion of the gate MW and the $V_C$ charge will be discharged through the source to ground. On the other hand, if the memory element is in the high threshold state, the read voltage $V_R$ will not cause an inversion region to be formed under the thin gate and the drain voltage $V_D$ will remain charged at $V_C$. Therefore, by monitoring a change in the drain voltage $V_D$, one can determine the state of the memory cell.

In summary, the novel MNOS transistor of the present invention employs the use of a thick gate region controlled by a polysilicon gate and a thin gate region defining a memory window MW controlled by an aluminum memory gate. The selective activation (addressing) of the orthogonally arranged polysilicon gate and memory gate determine the threshold state of a selected transistor memory cell among an array thereof.

It is apparent, that many modifications and variations may be affected of the above disclosed embodiment without departing from this scope of the novel concept of this invention. Therefore, it is intended by the appended claims to cover all such modifications and variations which fall within the true spirit and scope of the invention.

What is claimed is:

1. A MNOS transistor comprising:
   a substrate of a given conductivity type;
   a plurality of separated diffusion regions in said substrate of opposite conductivity type, defining drain and source diffusions;
   a first address gate defining a memory window between said diffusion regions;
   a second address gate overlapping said source diffusion and extending toward said memory window; and
   dual dielectric insulation means of different thicknesses associated with said gates for storing charges in a non-volatile manner.

2. A MNOS transistor as in claim 1, wherein said plurality of diffusion regions define parallel channels in said substrate; and said first address gate is formed of aluminum extending in a direction orthogonal to said channels.

3. A MNOS transistor as in claim 2, wherein said second address gate is formed of polysilicon and extends parallel to said channels.

4. A MNOS transistor as in claim 1, said dual dielectric insulation means further including:
   a layer of silicon dioxide and a layer of silicon nitride having a combined first thickness between said substrate and said first address gate at said memory window.

5. A MNOS transistor as in claim 1, said dual dielectric insulation means further including a layer of silicon oxide and a layer of silicon nitride having a combined second thickness between said source diffusion region and said second address gate adjacent to said memory window.

6. A MNOS transistor as in claim 1, further including:
   a layer of silicon oxide and a layer of silicon nitride having a combined first thickness between said substrate and said first address gate at said memory window;
   a layer of silicon oxide and a layer of silicon nitride having a combined second thickness between said source diffusion region and said second address gate adjacent said memory window;
   wherein said first thickness is less than said second thickness.

7. A MNOS transistor as in claim 1, further including:
   a third address gate overlapping said drain diffusion and extending toward said memory window.

8. A MNOS transistor as in claim 7, wherein said third address gate is formed of polysilicon and extends parallel to said channels.

9. A MNOS transistor as in claim 7, further said dual dielectric insulation means including:
   a layer of silicon dioxide and a layer of silicon nitride having a combined first thickness between said substrate and said first address gate at said memory window;
   a layer of silicon oxide and a layer of silicon nitride having a combined second thickness between both said substrate and said second address gate and said substrate and said third address gate;
   wherein said first thickness is less than said second thickness.

10. A MNOS transistor as in claim 7, wherein said transistor is characterized by having first and second threshold states set by selective activation of said first, second and third address gates with respect to said substrate, and said threshold state is read by measuring the amount of current discharge between said drain and said source when a read voltage having a value intermediate said threshold state values is applied to said first, second and third address gates.

11. A MNOS memory device having first and second threshold states, comprising:
   a substrate of a given conductivity type having a first surface;
   drain and source diffusion regions in isolated areas of said substrate exposed to said first surface;
   a memory gate above said surface defining a memory window between said drain and source diffusion regions;
   a plurality of address gates above said surface, each correspondingly overlapping one of said diffusion regions and extending in a direction toward said memory gate, wherein selective activation of said memory gate and said address gates with respect to said substrate, said drain region and said source region determine said threshold states, and including dual dielectric insulation means for non-volatile charge storage comprising;

a layer of silicon oxide and a layer of silicon nitride having a combined first thickness between said substrate and said memory gate at said memory window;

a layer of silicon oxide and a layer of silicon nitride having a combined second thickness between said diffusion region and said address gates adjacent said memory window;

wherein said first thickness is less than said second thickness;

further wherein, said threshold state is read by applying a read voltage to said memory gate and said address gates, grounding said substrate, applying a voltage charge to one of said diffusion regions and sensing whether or not said charge discharges from one diffusion region to the other said diffusion region.

12. A MNOS memory device as in claim 11, wherein said memory gate is formed of aluminum, said address gates are formed of polysilicon, and said gates are insulated from each other.

13. A MNOS memory device as in claim 11, wherein said substrate is N-type, said diffusion regions are P-type and said first threshold state is achieved by grounding said memory gate and said address gates, while a negative voltage is applied to said diffusion regions and said substrate having a value sufficient to cause tunneling through said layer of silicon oxide and said layer of silicon nitride at said memory window and creating a depletion region at said memory window.

14. An array of MNOS memory devices defining a plurality of addressable memory cells comprising:

a substrate of a given conductivity type providing a first surface;

a plurality of spaced diffusion regions of the opposite conductivity type in said substrate, each extending along a predetermined direction parallel to the others;

a plurality of spaced first address gates above said substrate surface each extending along a predetermined direction parallel to the direction of the others and said diffusion regions, each said plurality of said spaced first address gates corresponding to a separate one of said plurality of said diffusion regions and spacially overlapping the edges thereof;

a plurality of second address gates, each extending along a linear direction parallel to the others and intersecting said predetermined direction, each said second address gate defining a memory window at said substrate surface between each said plurality of diffusion regions; and dual dielectric insulation means of different thickness associated with said gates for storing charges in a non-volatile manner.

15. An array of MNOS memory devices as in claim 14, wherein each memory cell with a corresponding memory window is addressed by selective activation of a single corresponding first address gate extending adjacent to said corresponding memory window and by selective activation of a single corresponding second address gate which defines said corresponding memory window.

16. An array of MNOS memory devices as in claim 14, wherein said plurality of said first address gates are insulated from the said first surface by a layer of silicon dioxide and a layer of silicon nitride having a combined first thickness;

said plurality of second address gates are insulated from said first surface by a layer of silicon dioxide and a layer of silicon nitride having a combined second thickness at said memory window; wherein said first thickness is greater than said second thickness.

17. An array of MNOS memory devices as in claim 16, wherein each addressable memory cell comprises a transistor having a drain defined by a corresponding one of said plurality of diffusion regions, a source defined by a corresponding second one of said plurality of diffusion regions, and a gate region controlled by correspondingly intersecting ones of said plurality of first and second address gates.

* * * * *